(12) United States Patent
Li et al.

(10) Patent No.: US 12,149,014 B2
(45) Date of Patent: Nov. 19, 2024

(54) TERAHERTZ MIXER, METHOD OF MANUFACTURING TERAHERTZ MIXER, AND ELECTRONIC DEVICE INCLUDING TERAHERTZ MIXER

(71) Applicant: NUCTECH COMPANY LIMITED, Beijing (CN)

(72) Inventors: Yuanjing Li, Beijing (CN); Haifan Hu, Beijing (CN); Ziran Zhao, Beijing (CN); Xuming Ma, Beijing (CN)

(73) Assignee: NUCTECH COMPANY LIMITED, Beijing (CN)

( * ) Notice: Subject to any disclaimer, the term of this patent is extended or adjusted under 35 U.S.C. 154(b) by 504 days.

(21) Appl. No.: 17/418,951

(22) PCT Filed: Oct. 10, 2019

(86) PCT No.: PCT/CN2019/110358
§ 371 (c)(1),
(2) Date: Jun. 28, 2021

(87) PCT Pub. No.: WO2020/134331
PCT Pub. Date: Jul. 2, 2020

(65) Prior Publication Data
US 2022/0109241 A1 Apr. 7, 2022

(30) Foreign Application Priority Data
Dec. 29, 2018 (CN) .......................... 201811642822.4

(51) Int. Cl.
*H01Q 9/06* (2006.01)
*H01P 1/213* (2006.01)
*H01P 11/00* (2006.01)

(52) U.S. Cl.
CPC .......... *H01Q 9/065* (2013.01); *H01P 1/2135* (2013.01); *H01P 11/007* (2013.01)

(58) Field of Classification Search
CPC ..... H01Q 9/065; H01P 1/2135; H01P 11/007; H03D 9/02
See application file for complete search history.

(56) References Cited

U.S. PATENT DOCUMENTS

2012/0280742 A1    11/2012    Chattopadhyay et al.

FOREIGN PATENT DOCUMENTS

| CN | 104241191 A | * 12/2014 | ....... H01L 21/76838 |
|---|---|---|---|
| CN | 104377418 A | 2/2015 | |

(Continued)

OTHER PUBLICATIONS

Office Action issued on Mar. 16, 2023 for Chinese Application No. 201811642822.4 (9 pages).

(Continued)

*Primary Examiner* — Andrea Lindgren Baltzell
*Assistant Examiner* — Kimberly E Glenn
(74) *Attorney, Agent, or Firm* — Merchant & Gould P.C.

(57) ABSTRACT

The present disclosure provides a terahertz mixer, a method of manufacturing the terahertz mixer, and an electronic device including the mixer. The terahertz mixer includes: a cavity for forming a radio frequency input waveguide and a local oscillator input waveguide, and for accommodating a microstrip line; the microstrip line formed on at least a part of an inner surface of the cavity by using a semiconductor growth process, wherein the microstrip line extends into a portion of the cavity where the radio frequency input waveguide is located so as to form a microstrip antenna for receiving a radio frequency input signal, and into a portion of the cavity where the local oscillator input waveguide is located so as to form a microstrip antenna for receiving a local oscillator input signal.

19 Claims, 5 Drawing Sheets

(56) References Cited

FOREIGN PATENT DOCUMENTS

| CN | 104795620 A | 7/2015 |
| CN | 104811144 A | 7/2015 |
| CN | 105207625 A | 12/2015 |
| CN | 105896013 A | 8/2016 |
| CN | 109509952 A | 3/2019 |
| CN | 109509953 A | 3/2019 |
| CN | 209133660 U | 7/2019 |

OTHER PUBLICATIONS

Ignacio Llamas-Garro, et al., "Micromachined Transmission Lines for Millimeter-Wave Applications", IEE Computer Society, 2006, pp. 1-6.
International Search Report and Written Opinion of the International Searching Authority for International Patent Application No. PCT/CN2019/110358 mailed Dec. 30, 2019, 9 pages.

* cited by examiner

TERAHERTZ MIXER, METHOD OF MANUFACTURING TERAHERTZ MIXER, AND ELECTRONIC DEVICE INCLUDING TERAHERTZ MIXER

CROSS REFERENCE TO RELATED APPLICATION(S)

This application is a Section 371 National Stage Application of International Application No. PCT/CN2019/110358, filed on Oct. 10, 2018, which claims priority to Chinese Patent Application No. 201811642822.4, filed on Dec. 29, 2018, the content of which is incorporated herein by reference in its entirety.

TECHNICAL FIELD

The present disclosure related to a field of communications, and in particular to a terahertz mixer, a method of manufacturing the terahertz mixer, and an electronic device including the terahertz mixer.

BACKGROUND

In recent years, terahertz wave technology, as an important research field, has attracted more and more attention at home and abroad. According to atmospheric transmission characteristics of terahertz waves, water molecule absorption windows exist in proximity to 183 GHz, 320 GHz, 380 GHz and 664 GHz, which are key frequency bands for detecting atmospheric humidity contours. Millimeter waves of 94 GHz, 140 GHz and 220 GHz may be transmitted with small attenuation, and may be used by low-altitude air-to-surface missiles and ground-based radars based on point-to-point communications. Therefore, researches on these frequency bands are very important.

No matter a frequency band and an application of the terahertz wave, a reception of the terahertz wave is necessary. For a most commonly used superheterodyne system-based receiver, a mixer for a frequency down conversion is a key component. In a solid-state terahertz radar and communications system, because a low-noise amplifier is difficult to implement, the mixer becomes a first stage of a receiving end, so performance of the mixer is directly related to performance of an entire receiver system. Further, since it is difficult to achieve a high-performance local oscillator in the same frequency band, sub-harmonic mixing technology is an effective way to solve this problem. In a few types of mixers operable in the terahertz frequency band, only a terahertz sub-harmonic mixer based on a planar Schottky diode may operate at room temperature without providing, for example, liquid helium, to achieve a harsh low temperature environment, and is thus widely used.

For the terahertz band from 100 GHz to 500 GHz, a main receiver scheme at present is a superheterodyne receiver. In particular, when the frequency is higher than 200 GHz, a mixer based on silicon-based CMOS process and silicon-germanium CMOS process has a large conversion loss and is not suitable for application, so the terahertz subharmonic mixer based on a planar packaged gallium arsenide Schottky diode is mainly used.

In a related art, the terahertz subharmonic mixer based on a planar packaged gallium arsenide Schottky diode is mainly implemented by following schemes. Scheme 1 is to flip-chip bond the gallium arsenide Schottky diode on a quartz substrate microstrip line, with a metal cavity at a periphery. This scheme is simple and easy to implement, but also has obvious disadvantages. The Schottky diode needs to be flip-chip bonded by using conductive glue or gold wire, and it is not easy to control an alignment between the Schottky diode and the microstrip line. An alignment error may also exist in an assembly of the quartz microstrip line and the metal cavity. As the frequency increases, a difficulty of processing the metal cavity also gradually increases, and some sizes and angles are difficult to achieve. Scheme 2 is a monolithic integrated second harmonic mixer link structure based on gallium arsenide (Schottky diode and microstrip line are processed simultaneously by using gallium arsenide substrate), with a metal cavity at a periphery. This scheme may avoid the alignment problem of the diode and the microstrip line, but the alignment error also exists in the assembly of the gallium arsenide-based microstrip line and the metal cavity. An overall processing cost is higher than that of Scheme 1. Scheme 3 is to process a cavity structure by using a silicon-based micromechanical process, and the Schottky diode and the microstrip line are still implemented by using the conventional methods in Scheme 1 and Scheme 2. This scheme may reduce an overall weight of the mixer and also ensure a size of the cavity, but the alignment problem of the microstrip line and the cavity structure is not well solved.

SUMMARY

In view of this, objectives of the present disclosure are at least partly to provide a terahertz mixer in which an alignment accuracy of a microstrip line and a cavity may be well ensured, a method of manufacturing the terahertz mixer, and an electronic device including the terahertz mixer.

According to one aspect of the present disclosure, there is provided a terahertz mixer, includes: a cavity for forming a radio frequency input waveguide and a local oscillator input waveguide, and for accommodating a microstrip line; the microstrip line formed on at least a part of an inner surface of the cavity by using a semiconductor growth process, wherein the microstrip line extends into a portion of the cavity where the radio frequency input waveguide is located so as to form a microstrip antenna for receiving a radio frequency input signal, and into a portion of the cavity where the local oscillator input waveguide is located so as to form a microstrip antenna for receiving a local oscillator input signal.

According to another aspect of the present disclosure, there is provided a method of manufacturing a terahertz mixer, including: forming a groove structure on a silicon substrate or a gallium arsenide substrate; forming a metal layer on an inner surface of the silicon substrate or the gallium arsenide substrate and on a sidewall of the groove; and forming a microstrip line on at least a part of the metal layer.

According to a third aspect of the present disclosure, there is provided an electronic device including an integrated circuit formed by the terahertz mixer described above.

According to the embodiments of the present disclosure, the dielectric substrate for forming the microstrip line may be directly grown in the mixer cavity, and the size and position of the dielectric substrate (that is, silicon dioxide substrate) and the metal layer may be determined by photolithography and etching processes, so that the alignment accuracy of the microstrip line and the cavity may be ensured, and operation performance of the microstrip line mixer may be improved. Furthermore, because the dielectric substrate of the microstrip line is directly grown in the mixer cavity, it may be in good contact with the metal layer at the bottom, avoiding current problems of uneven application or air bubbles in the use of conductive silver glue, so that a controllability of the mixer processing technology may be ensured, and the operation performance of the microstrip mixer may be improved.

BRIEF DESCRIPTION OF THE DRAWINGS

The above and other objectives, features and advantages of the present disclosure will be more apparent through the following description of embodiments of the present disclosure with reference to the drawings.

Throughout the drawings, the same or similar reference numerals indicate the same or similar components.

DETAILED DESCRIPTION OF EMBODIMENTS

Figure 1:
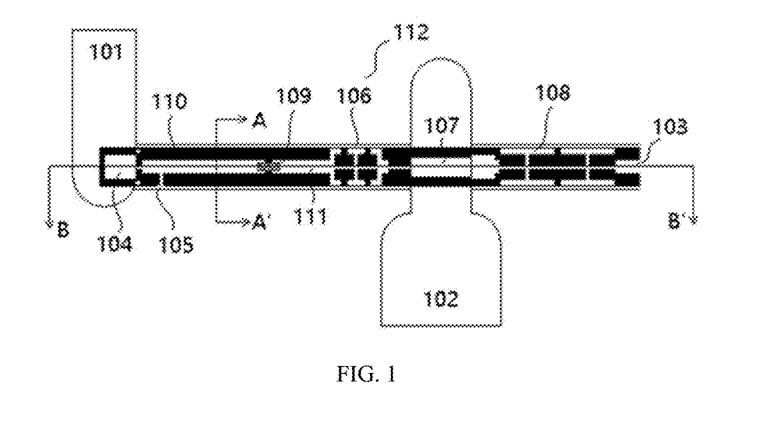
FIG. 1 shows a schematic structural diagram of a terahertz mixer according to some embodiments of the present disclosure.

A terahertz mixer according to the embodiments of the present disclosure is mainly implemented as a terahertz monolithic integrated microstrip line mixer by using a silicon-based micro-nano processing technology and a micro-machining technology. FIG. 1 shows an embodiment of an overall structure of the terahertz mixer.

The terahertz mixer is a monolithic integrated microstrip line mixer, mainly including a cavity structure and a microstrip circuit structure. The cavity is used for forming a radio frequency input waveguide and a local oscillator input waveguide, and for accommodating a microstrip line. As shown in FIG. 1, a cavity structure with a metal layer on a surface, a radio frequency input waveguide structure 101 and a local oscillator input waveguide structure 102 are formed by a silicon substrate (or a gallium arsenide substrate, which is not limited in the embodiment of the present disclosure). The microstrip circuit structure is arranged in the cavity surrounded by the metal layer. The microstrip circuit structure is directly grown by using a semiconductor growth technology and is formed on at least a part of an inner surface of the cavity. The microstrip line extends into a portion of the cavity where the radio frequency input waveguide is located so as to form a microstrip antenna for receiving a radio frequency input signal, and into a portion of the cavity where the local oscillator input waveguide is located so as to form a microstrip antenna for receiving a local oscillator input signal.

The microstrip circuit includes a dielectric substrate and a conduction band metal. The dielectric substrate is formed on at least a part of the metal layer in the cavity by using a semiconductor growth process, and the conduction band metal is further formed on a top surface of the dielectric substrate by using a semiconductor growth process. As shown in FIG. 1, a dielectric substrate (for example, silicon dioxide) 110 is formed, and a conduction band metal layer 111 of the microstrip circuit is formed on the dielectric substrate (for example, silicon dioxide) 110.

In other embodiments of the present disclosure, the dielectric substrate may also be implemented by other insulating materials such as a silicon nitride substrate or a gallium arsenide substrate, which is not limited by the embodiments of the present disclosure.

Further, an alignment mark for bonding the Schottky diode is provided on the conduction band metal layer 111. A gallium arsenide Schottky diode 109 may be provided on the microstrip circuit, by flip-chip bonding or by front bonding. The Schottky diode structure may also be directly grown on the silicon dioxide substrate by using a special process. The Schottky diode metal is connected to the microstrip line metal. Other composition parts of the mixer and dimension parameters thereof may be found documents.

The mixer may operate as follows. A terahertz signal to be received is transmitted in a waveguide-transition-microstrip structure, from a radio frequency input waveguide structure 101 to an antenna structure 104 of the microstrip line. A local oscillator signal enters from a local oscillator input waveguide port 102, passes through a microstrip transition structure 107 of a duplexer and a local oscillator low-pass filter structure 106, and is then mixed with the radio frequency signal in the gallium arsenide Schottky diode 109. The radio frequency signal is mixed with second harmonic of the local oscillator, and an intermediate frequency signal after difference passes through an intermediate frequency filter structure 108 and arrives at an intermediate frequency output port 103, and is then transmitted to a load through an external SMA connector. In order to avoid a DC offset caused by inconsistency of a Schottky diode pair, a ground line structure 105 connected to the metal cavity is led out from the microstrip circuit. The microstrip substrate (that is, the dielectric substrate) 110 is made of silicon dioxide. A metal 111 for forming the microstrip circuit is provided on the microstrip substrate 110. The cavity structure including a space for accommodating the radio frequency input waveguide 101, a space for accommodating the local oscillator input waveguide 102 and a space for accommodating the internal microstrip line is covered by a metal layer, and a silicon-based material 112 is provided at a periphery of the metal layer.

A radio frequency signal and a local oscillator signal are fed from respective ports, and are transferred to the microstrip line and then loaded onto a mixing diode after a corresponding matching network. The local oscillator signal may not leak from the radio frequency port because the local oscillator signal has a frequency lower than a waveguide cutoff frequency of the radio frequency port, and the radio frequency signal may not leak from a local oscillator port due to a presence of the local oscillator low-pass filter (passing the local oscillator frequency and blocking the radio frequency), so that isolation between the two ports may be achieved. The intermediate frequency signal generated by the mixing is output from the local oscillator duplexer through a microstrip low-pass filter.

The specific content of this solution will be described below in combination with more specific examples. It should be understood that the dimensions and proportions in the figures are only for illustration and have nothing to do with the actual structure.

Figure 2A:
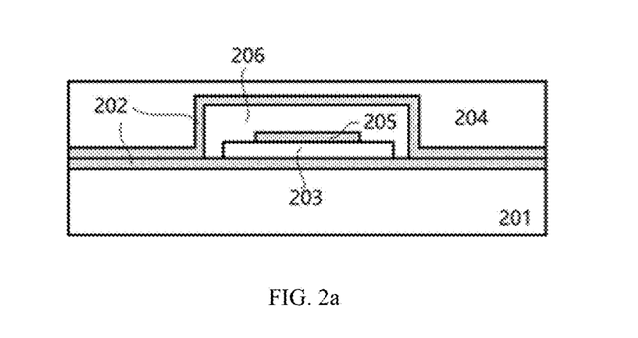
FIG. 2a and FIG. 2b show an exemplary cross-sectional view according to some embodiments of the present disclosure taken along line A-A' in FIG. 1.
Figure 2B:
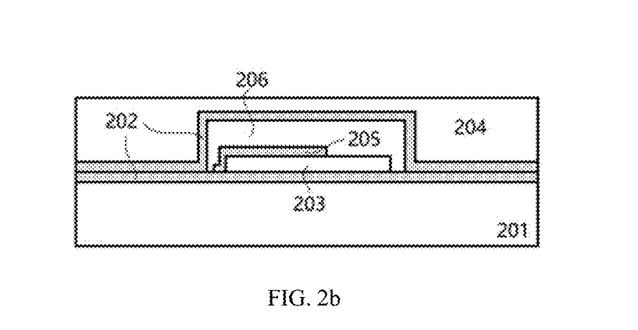

Referring to FIG. 2a and FIG. 2b, which show cross-sectional views taken along A-A' in FIG. 1. In this solution, the microstrip line structure is embedded inside a top wafer 204. FIG. 2a shows the cross-sectional view without a microstrip circuit grounding structure part, and FIG. 2b shows the cross-sectional view with the microstrip circuit grounding structure part. A silicon-based wafer 201 with a metal layer 202 grown thereon and a silicon-based wafer 204 with a groove structure and with the metal layer 202 grown thereon form a cavity structure 206.

A silicon dioxide layer substrate structure 203 is provided in the cavity, and a metal layer 205 is grown on the silicon dioxide layer substrate structure 203, so as to form the microstrip circuit structure.

Figure 3:
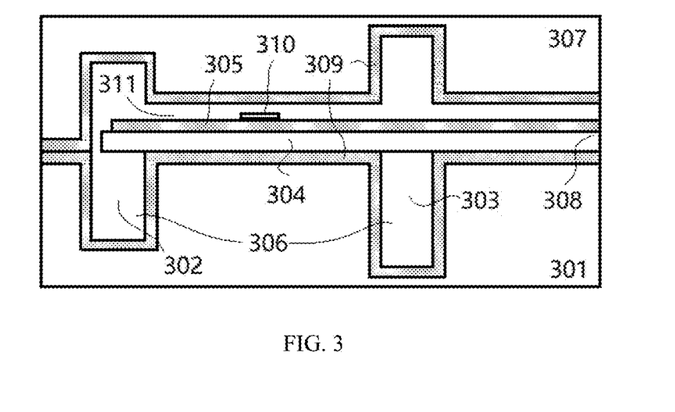
FIG. 3a shows an exemplary cross-sectional view according to some embodiments of the present disclosure taken along line B-B' in FIG. 1.

Referring to FIG. 3, which show a cross-sectional view taken along B-B' in FIG. 1. FIG. 3 shows the same scheme as FIG. 2a and FIG. 2b. A groove structure is formed on a silicon-based wafer 301, and a metal layer 309 is grown on the groove and a surface of the silicon-based wafer 301. A groove structure is formed on a silicon-based wafer 307, and the metal layer 309 is grown on the groove and a surface of the silicon-based wafer 307. A cavity structure 306 is formed by metal bonding. A radio frequency input waveguide 302, a local oscillator input waveguide 303 and a microstrip cavity part 311 are formed by bonding upper and lower silicon-based wafers 301 and 307, and may be reversely led out in space, as shown in FIG. 1. A silicon dioxide layer substrate structure 304 is provided in the cavity, and a metal layer 305 is grown on the silicon dioxide layer substrate structure 304, so as to form the microstrip circuit structure. A Schottky diode pair 310 is placed on the microstrip line, and an intermediate frequency output port 308 is led out on a side.

Figure 4A:
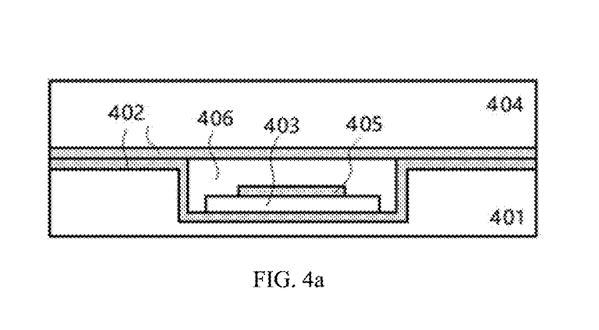
FIG. 4a and FIG. 4b show another exemplary cross-sectional view according to some embodiments of the present disclosure taken along line A-A' in FIG. 1.
Figure 4B:
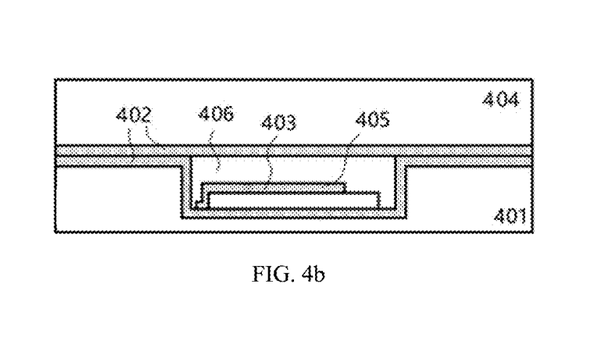

Referring to FIG. 4a and FIG. 4b, which show another exemplary scheme of the cross-sectional view taken along A-A' in FIG. 1, where the microstrip line is embedded inside a bottom wafer 401. FIG. 4a shows the cross-sectional view without a microstrip circuit grounding structure part, and FIG. 4b shows the cross-sectional view with the microstrip circuit grounding structure part. A silicon-based wafer 401 with a groove structure and with a metal layer 402 grown thereon and a silicon-based wafer 404 with the metal layer 402 grown thereon form a cavity structure 406. A silicon dioxide layer substrate structure 403 is provided in the cavity, and a metal layer 405 is grown on the silicon dioxide layer substrate structure 403, so as to form the microstrip circuit structure.

Figure 5:
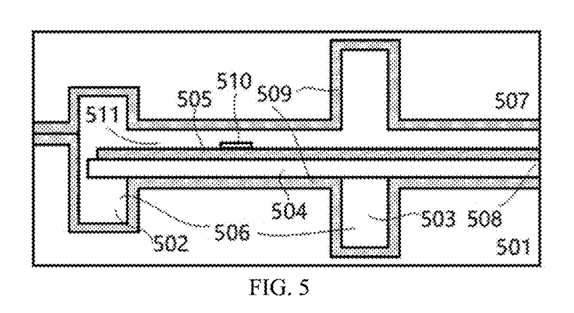
FIG. 5 shows another exemplary cross-sectional view according to some embodiments of the present disclosure taken along line B-B' in FIG. 1.

Referring to FIG. 5, which show a cross-sectional view taken along B-B' in FIG. 1. FIG. 5 shows the same scheme as FIG. 4a and FIG. 4b. A groove structure is formed on a silicon-based wafer 501, and a metal layer 509 is grown on the groove and a surface of the silicon-based wafer 501. A groove structure is formed on a silicon-based wafer 507, and the metal layer 509 is grown on the groove and a surface of the silicon-based wafer 507. A cavity structure 506 is formed by metal bonding. A radio frequency input waveguide 502, a local oscillator input waveguide 503 and a microstrip cavity part 511 are formed by bonding upper and lower silicon-based wafers 501 and 507, and may be reversely led out in space, as shown in FIG. 1. A silicon dioxide layer substrate structure 504 is provided in the cavity, and a metal layer 505 is grown on the silicon dioxide layer substrate structure 504, so as to form the microstrip circuit structure. A Schottky diode pair 510 is placed on the microstrip line, and an intermediate frequency output port 508 is led out on a side.

It is easy to understand that the internal microstrip line structure of the silicon-based monolithic integrated microstrip mixer may be embedded inside the top wafer or inside the bottom wafer according to actual design needs.

In addition, a DC grounding part of the silicon-based monolithic integrated microstrip mixer may be led out from the side of the microstrip line, or may be led out from another position (for example, between the radio frequency input waveguide port and the local oscillator input waveguide port), which is not limited in the present disclosure. When the DC grounding part is led out from another position, an overall impedance matching of the microstrip line needs to be re-optimized.

A method of manufacturing a mixer is described below with reference to FIG. 6a to FIG. 6d, with the structure of the mixer in FIG. 2a, FIG. 2b and FIG.3 as an example.

Figure 6A:
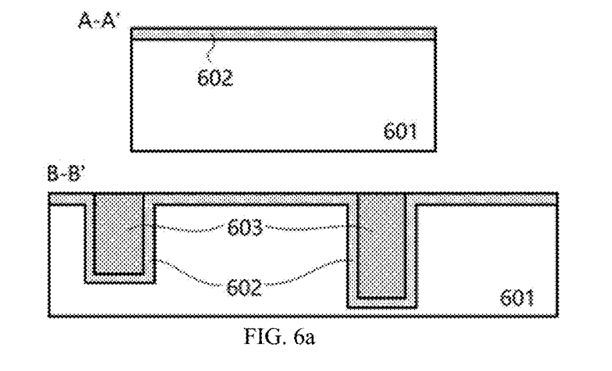
FIG. 6a to FIG. 6d show a flowchart of manufacturing a terahertz mixer according to some embodiments of the present disclosure.

Referring to FIG. 6a, a high-resistance silicon wafer 601 is used to prepare the cavity structure of the mixer and a support structure of the internal microstrip circuit. The high-resistance silicon wafer has a resistivity of 1 KΩ·cm to 10 KΩ·cm, and a thickness of 100 micrometers to 2000 micrometers. Firstly, the high-resistance silicon wafer 601 is groove-etched by using a deep groove etching process. Because the two deep groove structures have different depths, the groove-etching may be performed separately, or may be simultaneously performed through a deep and width adjustment. A groove etching depth may be 30 microns to 1500 microns, and an inclination angle of the groove is greater than 88°. A specific size needs to be determined according to a standard rectangular waveguide port and a design parameter. After the two deep groove structures are etched, metal may be grown by angular sputtering or evaporation so that the metal layer 602 may be formed on a groove sidewall and a surface of the silicon wafer 601. Then, the metal layer is grown by electroplating to a required thickness of about 0.5 microns to 5 microns, so as to ensure a skin depth of electromagnetic wave transmission. Next, a sacrificial material or a barrier layer is grown on the surface, and then the surface is flattened to the metal layer by using a chemical mechanical planarization process. In this way, the deep groove structure is filled with the sacrificial material 603, which needs to be etched clean when forming the waveguide input port later. FIG. 6a shows schematic cross-sectional diagrams of the process at positions A-A' and B-B' in FIG. 1, respectively.

Figure 6B:
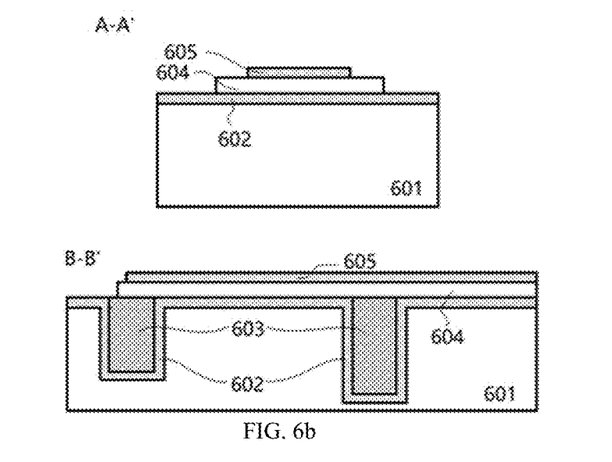

Referring to FIG. 6b, on the basis of the previous process, a silicon dioxide layer 604 is grown with a thickness of about 10 microns to 100 microns. Due to the large growth thickness, low-pressure chemical vapor deposition method or plasma-enhanced chemical vapor deposition method may be used for growth. In this way, the silicon dioxide layer may be densely grown on the metal and the sacrificial material. Then, by using a photolithography process, the remaining materials in a region that does not require silicon dioxide are etched and cleaned. Next, metal may be grown by sputtering or evaporation so that the metal layer 605 may be formed on a surface of the silicon dioxide layer 604. The metal layer is then grown by electroplating to a required thickness of about 0.5 microns to 5 microns, so as to ensure a skin depth of electromagnetic wave transmission. Then, by using a photolithography process, the remaining materials in a region that does not require metal are etched or peeled, and cleaned. In this way, the silicon dioxide layer 604 and the metal layer 605 form a microstrip line structure. The specific thickness and pattern size of the silicon dioxide layer 604 and that of the metal layer 605 may be determined according to an overall design index of the system. FIG. 6b shows schematic cross-sectional diagrams of the process at positions A-A' and B-B' in FIG. 1, respectively.

Figure 6C:
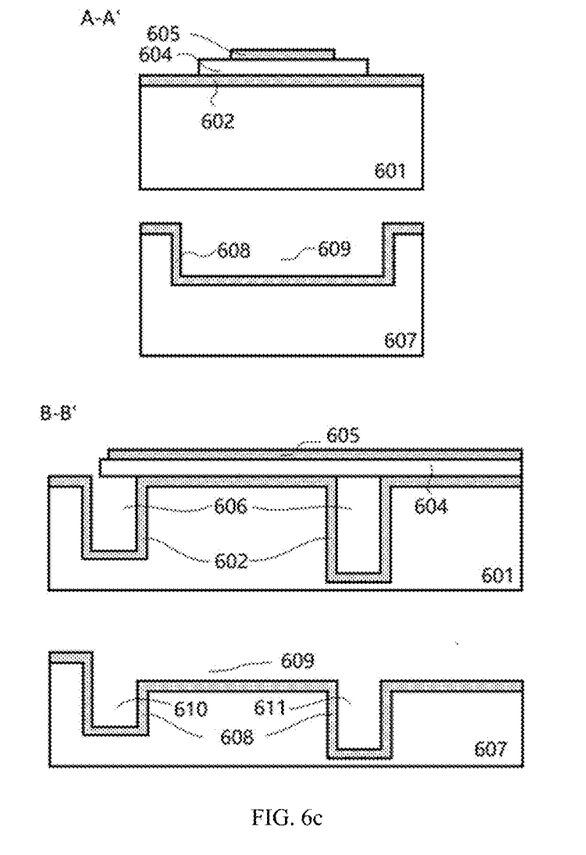

Referring to FIG. 6c, on the basis of the previous step, the sacrificial material 603 in the deep groove structure of the silicon wafer 601 is etched and cleaned. After the sacrificial material is etched, the silicon dioxide layer 604 and the metal layer 605 above the groove structure 606 may be in a suspended state, and there is no metal layer structure at the bottom. Then, the structure may be designed directly as required to form a microstrip antenna structure for providing a transition for transmission of the input radio frequency signal and the input local oscillator signal to the microstrip line. At the same time, another high-resistance silicon wafer 607 is used to prepare the cavity structure of the mixer. The high-resistance silicon wafer has a resistivity of 1 KΩ·cm to 10 KΩ·cm, and a thickness of 100 micrometers to 2000 micrometers. Firstly, the high-resistance silicon wafer 607 is groove-etched by using a deep groove etching process. The groove-etching needs to be performed on three regions, including a radio frequency input waveguide port region 610, a local oscillator input waveguide port region 611, and a microstrip cavity cover region 609. Because the deep groove structures have different depths, the groove-etching may be performed separately, or may be simultaneously performed through a deep and width adjustment. A groove etching depth may be 30 microns to 1500 microns, and an inclination angle of the groove is greater than 88°. A specific size needs to be determined according to a standard rectangular waveguide port and a design parameter. After the three deep groove structures are etched, metal may be grown by angular sputtering or evaporation so that the metal layer 608 may be formed on a groove sidewall and a surface of the silicon wafer 607. Then, the metal layer is grown by electroplating to a required thickness of about 0.5 microns to 5 microns, so as to give a margin to a skin depth of electromagnetic wave transmission. FIG. 6c shows schematic cross-sectional diagrams of the process at positions A-A' and B-B' in FIG. 1, respectively.

Figure 6D:
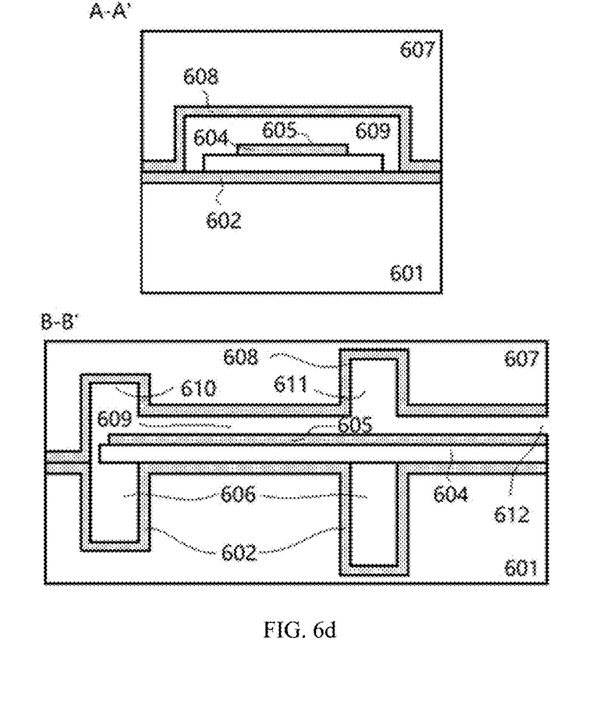

Referring to FIG. 6d, on the basis of the previous process, the silicon wafer 607 and the silicon wafer 601 are aligned upside down. A positioning hole or a photolithographic alignment mark may be used to control accuracy within 1 to 5 microns. After alignment, the two wafers may be completely bonded by using a wafer-level low-temperature Au—Au diffusion bonding process or the like. The Au—Au diffusion bonding process may also be performed on a single mixer unit to completely bond the upper and lower wafers. In this way, after the upper and lower groove structures are aligned and bonded, structures previously etched and grown with metal layers are used to respectively form the radio frequency input waveguide port 610, the local oscillator input waveguide port 611 and the microstrip cavity cover region 609. An intermediate frequency output terminal 612 is further formed at the other end. In the overall structure, a cavity structure with three ports is formed. The three ports correspond to 101 radio frequency input, 102 local oscillator input, and 103 intermediate frequency output in FIG. 1 respectively. Moreover, there are also a radio frequency input short-circuit surface and a local oscillator input short-circuit surface in the cavity, and the specific dimensions may be adjusted according to design requirements.

It should be noted that an exit direction of the waveguide port of the radio frequency input waveguide and an exit direction of the waveguide port of the local oscillator input waveguide may be arranged parallel to a normal direction of a plane where the microstrip line is located (H-surface probe) or perpendicular to a normal of the plane where the microstrip line is located (E-surface probe).

Figure 7:
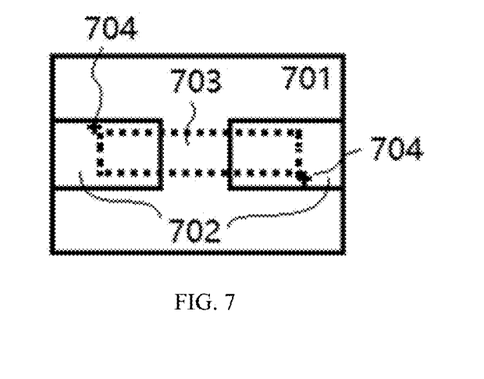
FIG. 7 shows a partial enlarged view of a Schottky diode according to some embodiments of the present disclosure.

FIG. 7 shows a partial enlarged diagram of the Schottky diode 109 of FIG. 1. The metal layer 702 grown on the silicon dioxide substrate 701 forms a microstrip line structure as a whole. The Schottky diode needs to be flip-chip bonded by using conductive glue or gold wire bonding. Alternatively, in the previous preparation process, a Schottky diode structure 703 may be directly grown on a silicon dioxide 701 by using a special process. After the metal layer 702 is grown and photoetched, an alignment mark 704 is made on the metal layer 702 according to a shape and a size of the Schottky diode to be used. The alignment mark may be a metal pattern or a pattern of an insulating material such as silicon dioxide. The pattern may be a cross-shaped mark or other marks that are convenient for the alignment of the Schottky diode. The alignment mark may define a placement position of the Schottky diode and determine that an angular offset is controllable. Then the Schottky diode is fixed on the microstrip line by using conductive glue or gold wire binding.

According to the embodiments of the present disclosure, the silicon dioxide substrate may be directly grown in the mixer cavity, and the size and position of the silicon dioxide substrate and the metal layer may be determined by photolithography and etching processes, so that the alignment accuracy of the microstrip line and the cavity may be ensured, and operation performance of the microstrip line mixer may be improved.

According to the embodiments of the present disclosure, the silicon dioxide substrate may be directly grown in the mixer cavity, and is in good contact with the metal layer at the bottom, avoiding current problems of uneven application or air bubbles in the use of conductive silver glue, so that a controllability of the mixer processing technology may be ensured, and the operation performance of the microstrip mixer may be improved.

According to the embodiments of the present disclosure, the Schottky diode has a directly grounded structure. By using metal layer photolithography and etching processes, it may be short-circuited with the metal layer beside the microstrip line, and a shape and a size of the short-circuit line may be accurately controlled. This avoids introducing uncertain factors in the conductive silver glue or gold wire binding process, and provides a strong guarantee for the consistency of the mixer's early design and performance testing.

In the mixer cavity structure according to the embodiments of the present disclosure, a silicon-based material based on micro-machining is used, which greatly reduces costs and an overall weight of the device compared with currently-used brass material. The microstrip line is made of the insulating material such as silicon dioxide or silicon nitride, which has good compatibility with silicon-based processes, so that the processing cost is reduced while ensuring the stability of the process. In addition, this type of silicon-based mixer device may be directly integrated with other active or passive devices, such as low noise amplifier, wave detector, and peripheral bias circuit. This paved the way for further system integration.

In the mixer cavity structure according to the embodiments of the present disclosure, by using the deep groove etching process, the size of the internal cavity may be accurately controlled, which breaks through a limit of small-size processing of the metal cavity and provides a design idea for an application of a mixer with a higher frequency. The mixer cavity structure in the present disclosure may also be used in combination with a quartz substrate microstrip line or a monolithic integrated gallium arsenide substrate microstrip line. A type of the silicon-based monolithic integrated microstrip mixer according to the embodiments of the present disclosure is not limited. It may be a single-ended, single-balanced, double-balanced, triple-balanced, or I/Q passive mixer, or may be an active frequency multiplier. This greatly improves the flexibility of system design.

The terahertz mixer according to the embodiments of the present disclosure is applicable to various electronic devices. For example, by integrating a plurality of such mixers and other devices (for example, other forms of transistors, etc.), it is possible to form an integrated circuit (IC) and thereby construct an electronic device. Therefore, the present disclosure further provides an electronic device including the terahertz mixer described above. The electronic device may further include components such as a display screen matched with the integrated circuit and a wireless transceiver matched with the integrated circuit. Such electronic device includes smart phone, computer, tablet computer (PC), wearable smart device, mobile power supply, and so on.

In addition, the structure and method of the silicon-based monolithic integrated device are not limited to the application of mixers, but may also be used in a frequency multiplier.

The terahertz silicon-based monolithic integrated microstrip mixer of the present disclosure may be implemented to reduce the weight and cost of the device while improving the processing accuracy of the mixer, so that the performance of the mixer may be improved, and favorable conditions may be provided for further systematic integration.

Although the present disclosure has been described above in conjunction with preferred embodiments of the present disclosure, those skilled in the art shall understand that various modifications, substitutions and changes may be made to the present disclosure without departing from the spirit and scope of the present disclosure. Therefore, the present disclosure should not be limited by the embodiments described above, but should be defined by the appended claims and their equivalents.

What is claimed is:

1. A terahertz mixer, comprising:
   a cavity for forming a radio frequency input waveguide and a local oscillator input waveguide, and for accommodating a microstrip line; and
   the microstrip line formed on at least a part of an inner surface of the cavity by using a semiconductor growth process, wherein the microstrip line extends into a portion of the cavity where the radio frequency input waveguide is located so as to form a microstrip antenna for receiving a radio frequency input signal, and into a portion of the cavity where the local oscillator input waveguide is located so as to form a microstrip antenna for receiving a local oscillator input signal,
   wherein the cavity is formed by a silicon substrate or a gallium arsenide substrate, a groove structure is formed on the silicon substrate or the gallium arsenide substrate, a metal layer is formed on an inner surface of the silicon substrate or the gallium arsenide substrate and on a sidewall of the groove structure, and the cavity is formed by bonding of the metal layer.

2. The terahertz mixer of claim 1, wherein the microstrip line comprises:
   a dielectric substrate formed on at least a part of the metal layer by using a semiconductor growth process; and
   a conduction band metal formed on at least a part of a top surface of the dielectric substrate by using a semiconductor growth process.

3. The terahertz mixer of claim 2, wherein the dielectric substrate comprises a silicon dioxide substrate, a silicon nitride substrate or a gallium arsenide substrate.

4. The terahertz mixer of claim 2, wherein the dielectric substrate has a thickness of 10 μm to 100 μm.

5. The terahertz mixer of claim 2, wherein the conduction band metal is electrically connected to the metal layer.

6. The terahertz mixer of claim 2, wherein a thickness of the metal layer is determined according to a skin depth requirement of an electromagnetic wave transmission.

7. The terahertz mixer of claim 2, wherein the metal layer has a thickness of 0.5 μm to 5 μm.

8. The terahertz mixer of claim 2, wherein the groove structure comprises a first groove for forming the radio frequency input waveguide and a second groove for forming the local oscillator input waveguide, a depth direction of the first groove and a depth direction of the second groove are arranged parallel to a normal line of a plane where the microstrip line is located.

9. The terahertz mixer of claim 2, wherein an exit direction of a waveguide port of the radio frequency input waveguide and an exit direction of a waveguide port of the local oscillator input waveguide are arranged parallel to or perpendicular to a normal line of a plane where the microstrip line is located.

10. The terahertz mixer of claim 2, further comprising:
    a Schottky diode, wherein the Schottky diode is flip-chip bonded or front bonded on the dielectric substrate, or formed on the dielectric substrate by using a semiconductor growth process, and the Schottky diode is electrically connected to the conduction band metal.

11. The terahertz mixer of claim 10, wherein an alignment mark is provided on the conduction band metal, and the alignment mark is provided to perform an alignment for bonding the Schottky diode.

12. An electronic device comprising an integrated circuit formed by the terahertz mixer of claim 1.

13. A method of manufacturing a terahertz mixer, comprising:
    forming a groove structure on a silicon substrate or a gallium arsenide substrate;
    forming a metal layer on an inner surface of the silicon substrate or the gallium arsenide substrate and on a sidewall of the groove structure;
    forming a microstrip line on at least a part of the metal layer; and
    forming a cavity by bonding of the metal layer,
    wherein the cavity is formed by the silicon substrate or the gallium arsenide substrate, and the cavity is for forming a radio frequency input waveguide and a local oscillator input waveguide and for accommodating the microstrip line.

14. The method of claim 13, wherein the forming a groove structure on a silicon substrate or a gallium arsenide substrate comprises:
    forming a first groove and a second groove on the silicon substrate or the gallium arsenide substrate by using separate etching or by using depth and width adjustment-based simultaneous etching, wherein a parameter of the first groove and a parameter of the second groove are is determined according to a rectangular waveguide port standard and a design parameter.

15. The method of claim 14, wherein the forming a metal layer on an inner surface of the silicon substrate or the gallium arsenide substrate and on a sidewall of the groove structure comprises:
forming the metal layer on the inner surface of the silicon substrate or the gallium arsenide substrate and on the sidewall of the groove structure by using a semiconductor growth process; and
growing the metal layer to a predetermined thickness by using an electroplating process.

16. The method of claim 15, wherein a thickness of the metal layer is determined according to a skin depth requirement of an electromagnetic wave transmission.

17. The method of claim 16, further comprising: prior to the forming a microstrip line on at least a part of the metal layer,
growing a sacrificial material or a barrier layer on the metal layer; and
flattening the sacrificial material or the barrier layer formed to the metal layer by using a planarization process, so as to form a sacrificial layer structure in the first groove and the second groove.

18. The method of claim 17, wherein the forming a microstrip line on at least a part of the metal layer comprises:
forming a dielectric layer on the metal layer by using a semiconductor growth process;
removing a part of the dielectric layer by using an etching process, so as to form a dielectric substrate on at least a part of the metal layer;
forming a conduction band metal layer on the dielectric substrate by using a semiconductor growth process;
growing the conduction band metal layer to a predetermined thickness by using an electroplating process; and
removing a part of the conduction band metal layer by using an etching process, so as to form a conduction band metal on at least a part of a top surface of the dielectric substrate.

19. The method of claim 18, further comprising: subsequent to the forming a microstrip line on at least a part of the metal layer,
removing the sacrificial layer structure in the first groove and the second groove, so that a portion of the microstrip line above the first groove and a portion of the microstrip line above the second groove are in a suspended state, so as to form a microstrip antenna.

* * * * *